United States Patent
Poo et al.

(10) Patent No.: US 6,582,992 B2
(45) Date of Patent: Jun. 24, 2003

(54) STACKABLE SEMICONDUCTOR PACKAGE AND WAFER LEVEL FABRICATION METHOD

(75) Inventors: Chia Yong Poo, Singapore (SG); Boon Suan Jeung, Singapore (SG); Low Siu Waf, Singapore (SG); Chan Min Yu, Singapore (SG); Neo Yong Loo, Singapore (SG); Chua Swee Kwang, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/222,294

(22) Filed: Aug. 15, 2002

(65) Prior Publication Data

US 2003/0096454 A1 May 22, 2003

Related U.S. Application Data

(62) Division of application No. 10/042,560, filed on Nov. 16, 2001.

(51) Int. Cl.[7] ................................................ H01L 21/44
(52) U.S. Cl. ........................ 438/109; 438/107; 438/117; 257/686
(58) Field of Search ................................. 438/109, 107, 438/117; 257/686, 726; 361/735, 803

(56) References Cited

U.S. PATENT DOCUMENTS

| | | | |
|---|---|---|---|
| 4,505,799 A | 3/1985 | Baxter | |
| 4,996,587 A | 2/1991 | Hinrichsmeyer et al. | |
| 5,063,177 A | 11/1991 | Geller et al. | |
| 5,107,328 A | 4/1992 | Kinsman | |
| 5,138,434 A | 8/1992 | Wood et al. | |
| 5,155,067 A | 10/1992 | Wood et al. | |
| 5,229,647 A | 7/1993 | Gnadinger | |
| 5,266,912 A | 11/1993 | Kledzik | |
| 5,334,857 A | 8/1994 | Mennitt et al. | |
| 5,384,689 A | 1/1995 | Shen | |
| 5,434,745 A * | 7/1995 | Shokrgozar et al. | ........ 361/735 |
| 5,444,296 A | 8/1995 | Kaul et al. | |
| 5,468,999 A | 11/1995 | Lin et al. | |
| 5,474,957 A | 12/1995 | Urushima | |
| 5,562,971 A | 10/1996 | Tsuru et al. | |
| 5,633,530 A | 5/1997 | Hsu | |
| 5,646,828 A | 7/1997 | Degani et al. | |
| 5,674,785 A | 10/1997 | Akram et al. | |
| 5,677,566 A | 10/1997 | King et al. | |
| 5,689,091 A | 11/1997 | Hamzehdoost et al. | |
| 5,696,033 A | 12/1997 | Kinsman | |
| 5,723,900 A | 3/1998 | Kojima et al. | |

(List continued on next page.)

OTHER PUBLICATIONS

U.S. patent application Publication 2002/0061665 A1 by Batinovich U.S. class 439/71.

*Primary Examiner*—David Nelms
*Assistant Examiner*—Thinh Nguyen
(74) *Attorney, Agent, or Firm*—Stephen A. Gratton (57) ABSTRACT

A stackable semiconductor package includes a semiconductor die, and has a chip sized peripheral outline matching that of the die. In addition to the die, the package includes stacking pads and stacking contacts on opposing sides of the die, and conductive grooves on the edges of the die in electrical communication with the stacking pads and the stacking contacts. The conductive grooves function as interlevel conductors for the package and can also function as edge contacts for the package. The configuration of the stacking pads, of the stacking contacts and of the conductive grooves permit multiple packages to be stacked and electrically interconnected to form stacked assemblies. A method for fabricating the package is performed at the wafer level on a substrate, such as a semiconductor wafer, containing multiple dice. In addition, multiple substrates can be stacked, bonded and singulated to form stacked assemblies that include multiple stacked packages.

19 Claims, 9 Drawing Sheets

U.S. PATENT DOCUMENTS

| | | | |
|---|---|---|---|
| 5,723,901 A * | 3/1998 | Katsumata | 257/686 |
| 5,739,585 A | 4/1998 | Akram et al. | |
| 5,753,857 A | 5/1998 | Choi | |
| 5,763,939 A | 6/1998 | Yamashita | |
| 5,789,803 A | 8/1998 | Kinsman | |
| 5,796,038 A | 8/1998 | Manteghi | |
| 5,811,879 A | 9/1998 | Akram | |
| 5,995,379 A * | 11/1999 | Kyougoku et al. | 361/803 |
| 6,013,948 A | 1/2000 | Akram et al. | |
| 6,020,629 A * | 2/2000 | Farnworth et al. | 257/686 |
| 6,107,109 A | 8/2000 | Akram et al. | |
| 6,208,546 B1 | 3/2001 | Ikeda | |
| 6,235,554 B1 | 5/2001 | Akram et al. | |
| 6,271,056 B1 | 8/2001 | Farnworth et al. | |
| 6,274,929 B1 * | 8/2001 | Long et al. | 257/724 |
| 6,278,616 B1 * | 8/2001 | Gelsomini et al. | 361/803 |
| 6,303,981 B1 | 10/2001 | Moden | |
| 6,310,390 B1 | 10/2001 | Moden | |
| 6,368,896 B2 | 4/2002 | Farnworth et al. | |
| 6,380,555 B1 | 4/2002 | Hembree et al. | |
| 6,420,789 B1 | 7/2002 | Tay | |
| 6,429,509 B1 | 8/2002 | Hsuan | |
| 6,451,624 B1 | 9/2002 | Farnworth et al. | |

* cited by examiner

STACKABLE SEMICONDUCTOR PACKAGE AND WAFER LEVEL FABRICATION METHOD

CROSS REFERENCE TO RELATED APPLICATION

This application is a division of application Ser. No. 10/042,560 filed on Nov. 16, 2001.

FIELD OF THE INVENTION

This invention relates generally to semiconductor packaging, and specifically to a stackable semiconductor package having a chip scale outline. This invention also relates to a wafer level method for fabricating the package, and to assemblies incorporating multiple stacked packages.

BACKGROUND OF THE INVENTION

Decreases in the size of electronic devices, particularly hand held devices, has led to the development of smaller semiconductor packages. One type of semiconductor package is referred to as a chip scale package (CSP). A chip scale package includes a semiconductor die, and a lead system for transmitting signals and power to the die.

The chip scale package has a peripheral outline (footprint) that is only slightly larger than that of the die contained in the package (e.g., 1.2 times the die outline). Typically, the chip scale package includes a substrate, such as a board or a tape material, which contains the lead system for the package. The chip scale package can also include a casing configured to protect, and to insulate the die and the lead system.

The present invention is directed to a chip scale package having an outline that is the same as that of the die which it contains. The package thus possesses a true chip scale profile. In addition, the lead system for the package is formed directly on the die, without the requirement of a separate substrate.

In addition to a chip sized outline, it is advantageous for a package to be configured to facilitate assembly in electronic devices and electronic systems in dense arrays. For example, printed circuit boards, multi chip modules, and other electronic devices as well, preferably contain multiple packages in as small an area as possible. One technique for fabricating electronic devices and systems with dense arrays of packages is to stack the packages on one another to form a stacked assembly. This requires that the lead systems for all of the packages in a stacked assembly be configured for interconnection.

The present invention is directed to a chip scale package having a stackable configuration. As such, a lead system for the package permits interconnection of multiple packages to form a stacked assembly which includes any desired number of packages. Further, the package of the invention includes contacts on both major surfaces, and on the edges of the package as well, such that connections to other packages, or to other electronic elements of a electronic device or system is facilitated.

Another consideration in the design of chip scale packages is the method for fabricating the packages. The chip scale package of the present invention can be fabricated using a wafer level fabrication method that is simple, reliable and capable of volume manufacture using conventional equipment.

SUMMARY OF THE INVENTION

In accordance with the present invention, an improved stackable semiconductor package, a method for fabricating the package, and a stacked assembly that includes multiple stacked packages are provided.

The package includes a semiconductor die containing integrated circuits in a desired configuration (e.g., DRAM, SRAM etc.). The package has peripheral edges, and a peripheral outline (footprint) that correspond to the edges and the outline of the die. In addition, the package has a circuit side (first side) and a back side (second side) that correspond to the circuit side and the back side of the die.

In addition to the die, the package includes circuit side stacking pads, and circuit side conductors in electrical communication with the integrated circuits on the die. The package also includes back side stacking pads on the back side, and back side conductors on the back side in electrical communication with the circuit side conductors. In addition, the package includes conductive grooves (castellations) in one or more edges thereof, configured as interlevel conductors between the circuit side and the back side of the package. The plated grooves can also function as edge contacts for interconnecting multiple packages in a stacked assembly, or for electrically connecting the package, or the stacked assembly, to a supporting substrate, such as a circuit board.

The package also includes stacking contacts, such as bumps or balls, formed on the circuit side stacking pads, or alternately on the back side stacking pads. The stacking contacts are configured for mating engagement with the stacking pads on an adjacent stacked package. The stacking contacts permit multiple packages to be stacked to one another, with the stacking contacts and the stacking pads on adjacent packages bonded to one another. In addition, the package can include external contacts on the back side, such as bumps or balls, configured to physically and electrically attach the package, or a stacked assembly, to a supporting substrate.

The method for fabricating the package includes the initial step of providing a substrate, such as a wafer or portion thereof, which contains multiple semiconductor dice separated by spaces. The spaces can be configured as streets for saw cutting, or otherwise singulating, the dice from the substrate into separate packages. The method also includes the steps of forming circuit side conductors, and circuit side stacking pads, on the dice contained on the substrate. The circuit side conductors, and the circuit side stacking pads, can be formed by deposition and etching of a metal redistribution layer. In addition, the method includes the step of forming back side conductors, and back side stacking pads, on the dice contained on the substrate. The back side conductors, and the back side stacking pads, can also be formed by deposition and etching of a metal redistribution layer.

The method also includes the step of forming conductive vias in the substrate in the spaces between the dice. The conductive vias can be formed by etching openings in the substrate, insulating the openings, and then covering the walls of the openings (or completely filling the openings) with a conductive material, such as a metal or a conductive polymer. The conductive vias are configured such that during a singulation step, the dice are singulated into separate packages, and separate portions of the conductive vias remain with different packages. The separate portions of the conductive vias form the conductive grooves in the edges of the packages.

The method also includes the steps of forming the stacking contacts on the stacking pads, and if required, forming the external contacts on the back side. Prior to the singulation step, two or more substrates can be stacked to one another, and the stacking contacts on a first substrate bonded to the stacking pads on an adjacent second substrate. The singulation step can thus be used to form stacked assemblies that contain any desired number of stacked packages.

DETAILED DESCRIPTION OF THE PREFERRED EMBODIMENTS

Referring to FIGS. 1A–1F, a semiconductor package 10 constructed in accordance with the invention is illustrated. The package 10 includes a semiconductor die 12, and has a peripheral outline substantially identical to that of the die 12. Accordingly, the package 10 has a true chip outline or profile.

The die 12 includes a semiconductor substrate 14 (FIG. 1F), such as silicon or gallium arsenide, containing integrated circuits 16 (FIG. 1F) fabricated using well known processes. The die 12 can be a conventional semiconductor device such as a dynamic random access memory (DRAM), a synchronous DRAM (SDRAM), a static random-access memory (SRAM), an erasable programmable read-only memory (EPROM), a logic circuit (LOGIC), or any other semiconductor device that requires packaging.

Figure 1A:
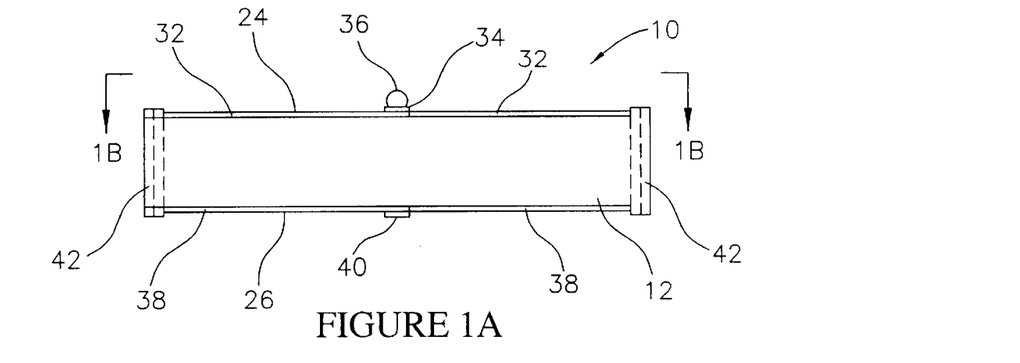
FIG. 1A is an enlarged side elevation view of a semiconductor package constructed in accordance with the invention.
Figure 1B:
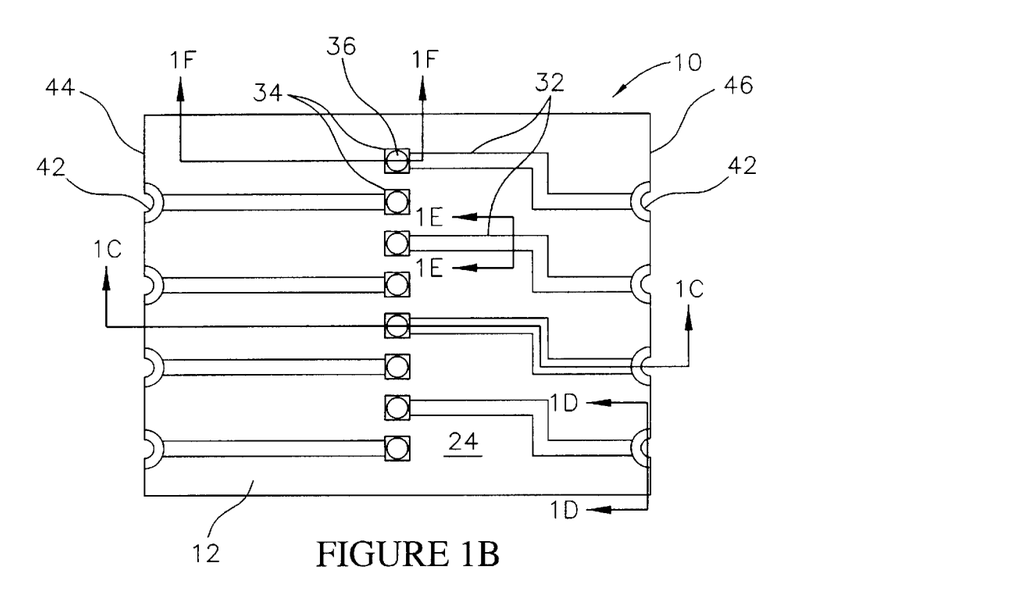
FIG. 1B is an enlarged plan view of the package taken along line 1B—1B of FIG. 1A.
Figure 1C:
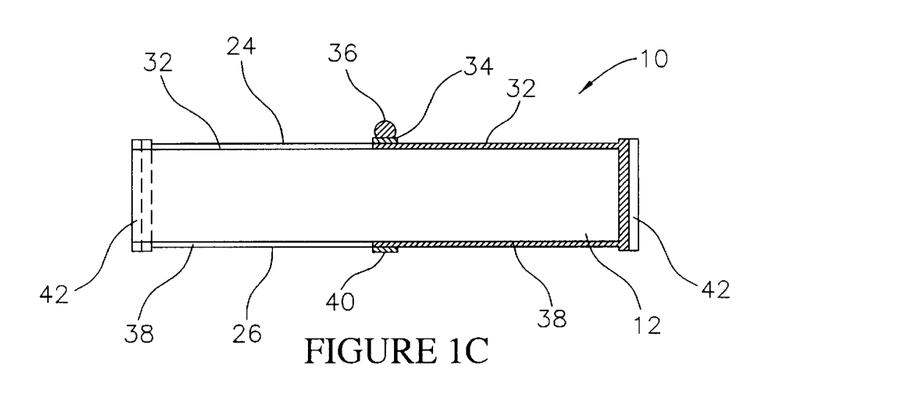
FIG. 1C is an enlarged cross sectional view of the package taken along line 1C—1C of FIG. 1B.
Figure 1D:
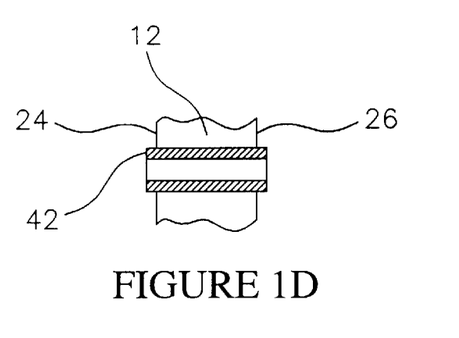
FIG. 1D is an enlarged cross sectional view of a portion of the package taken along line 1D—1D of FIG. 1B illustrating a conductive groove of the package.
Figure 1E:
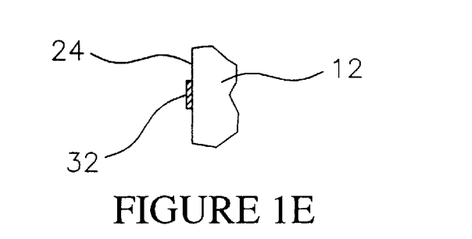
FIG. 1E is an enlarged cross sectional view of a portion of the package taken along line 1E—1E of FIG. 1B illustrating a conductor of the package.
Figure 1F:
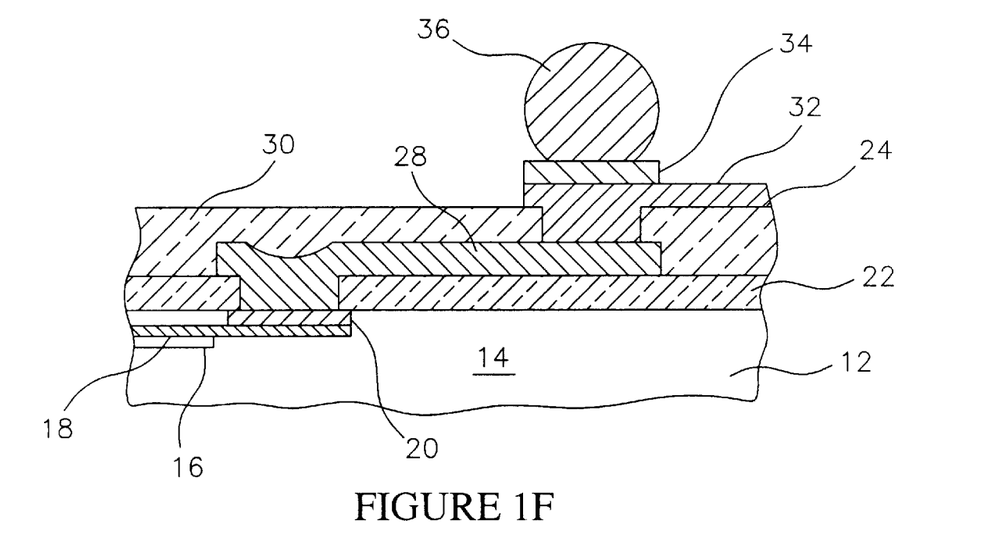
FIG. 1F is an enlarged cross sectional view of a portion of the package taken along line 1F—1F of FIG. 1B illustrating a stacking contact and a stacking pad of the package.

The die 12 includes conductive traces 18 (FIG. 1F), and die bond pads 20 (FIG. 1F) in electrical communication with the integrated circuits 16 (FIG. 1F). In addition, the die 12 includes a die passivation layer 22 (FIG. 1F) formed of an electrically insulating material such as BPSG. Further, the die 12 includes a plurality of redistribution conductors 28 (FIG. 1F) in electrical communication with the die bond pads 20 (FIG. 1F), and an insulating layer 30 (FIG. 1F) on the redistribution conductors 28.

The package 10 has a circuit side 24 (first side in the claims) and a back side 26 (second side in the claims). The circuit side 24 of the package 10 is located proximate to the circuit side of the die 12, and proximate to the integrated circuits 16 (FIG. 1F) contained on the die 12. The circuit side 24 of the package 10 is also located proximate to the die bond pads 20 (FIG. 1F), to the conductive traces 18 (FIG. 1F), and to the die passivation layer (FIG. 1F) of the die 12. The back side 26 of the package 10 is located proximate to the back side of the die 12.

The package 10 also includes a plurality of circuit side conductors 32 (first conductors in the claims), and a plurality of circuit side stacking pads 34 (first pads in the claims) in electrical with the circuit side conductors 32. The circuit side conductors 32 are formed on the insulating layer 30, and are also in electrical communication with the redistribution conductors 28 (FIG. 1F), the die bond pads 20 (FIG. 1F) and the integrated circuits 16 (FIG. 1F) of the die 12. The circuit side conductors 32 preferably comprise a highly conductive metal such as aluminum, copper, nickel, silver, tungsten, tantalum, palladium, or alloys of these metals. The circuit side stacking pads 34 can comprise the same metal as the circuit side conductors 32, or alternately a nonoxidizing metal such as gold, platinum or alloys of these metals.

The package 10 also includes stacking contacts 36 on the circuit side stacking pads 34. In the illustrative embodiment, the stacking contacts 36 comprise metal bumps or balls formed of a non-oxidizing metal such as gold or platinum. As will be further explained, the stacking contacts 36 permit multiple packages 10 to be stacked, bonded and placed in electrical communication with one another.

The package 10 also includes a plurality of back side conductors 38 (second conductors in the claims), and a plurality of back side stacking pads 40 (second pads in the claims) in electrical with the back side conductors 38. The back side conductors 38 preferably comprise a highly conductive metal such as aluminum, copper, nickel, silver, tungsten, tantalum, palladium, or alloys of these metals. The back side stacking pads 40 can comprise the same metal as the back side conductors 38, or alternately a non-oxidizing metal such as gold, platinum or alloys of these metals. In addition, the back side stacking pads 40 are formed in a pattern that exactly matches the pattern of the circuit side stacking pads 34. This arrangement permits multiple packages 10 to be stacked, with the stacking contacts 36 and the stacking pads 40 on adjacent packages 10 physically bonded, and electrically connected, to one another.

In the illustrative embodiment, the package 10 includes eight stacking contacts 36 in a center array, which comprises a single row located along the center line of the package 10. However, this arrangement is merely exemplary, and any other contact array known in the art can be used to construct the package 10. For example, the stacking contacts 36 can be arranged in a dense grid array that includes multiple rows and columns and up to several hundred stacking contacts 36. As another example, the stacking contacts can be arranged in a peripheral array along the edges of the package 10. Whatever array is selected, the stacking contacts 36, the circuit stacking pads 34 and the back side stacking contacts 40 will have matching identical patterns, and preferably matching sizes.

The package 10 also includes a plurality of conductive grooves 42 (castellations) formed in opposing edges 44, 46 of the package 10. The conductive grooves 42 are in electrical communication with the circuit side conductors 32, and with the back side conductors 38. Preferably the conductive grooves 42 are configured such that pairs of conductive grooves 42 on the opposing edges 44, 46 are co-linear (i.e., located along a common axis) which facilitates the fabrication method to be hereinafter described. In addition, the conductive grooves 42 preferably include electrically insulating layers 94 (FIG. 8F) which provide electrical insulation from the substrate 14.

The conductive grooves 42 function as interlevel conductors between the circuit side conductors 32 and the back side conductors 38. In addition, the conductive grooves 42 can function to interconnect adjacent packages 10 in a stacked assembly. Further, the conductive grooves 42 can function as edge contacts for electrically connecting and inputting signals from the outside to the package 10. The package 10 can be used for any conventional application, but is particularly suited to fabricating the stacking assemblies to be hereinafter described. In the case where the package 10 is not stacked, the stacking contacts 36 and the conductive grooves 42 can function as external contacts for the package 10.

Figure 2:
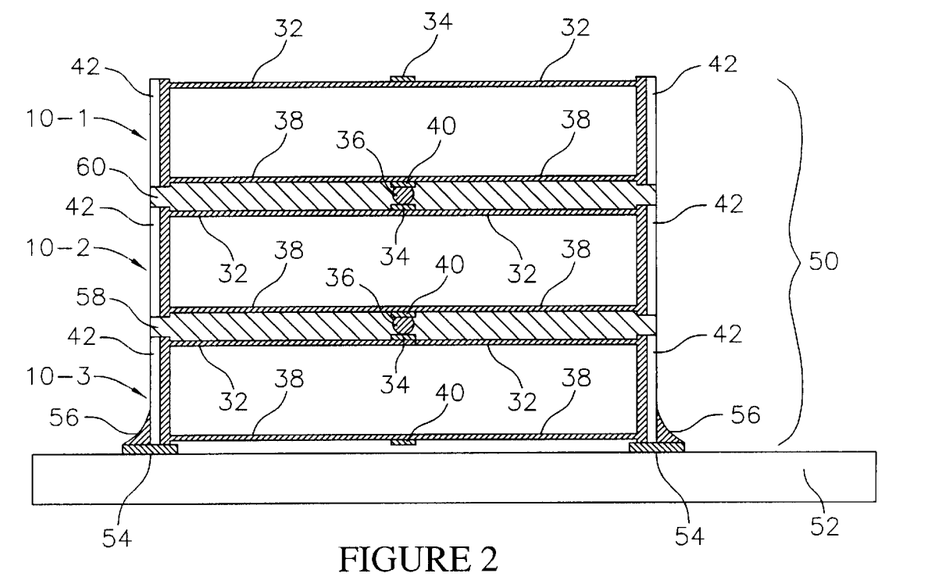
FIG. 2 is an enlarged cross sectional view of a stacked assembly constructed using the package of FIG. 1A.

Referring to FIG. 2, a stacked assembly 50 fabricated using three packages 10-1, 10-2, 10-3 is illustrated. Each of the packages 10-1, 10-2, 10-3 is constructed substantially as previously described for the package 10 shown in FIGS. 1A–1F. In addition, although the stacked assembly 50 includes three packages, any number of packages greater than two can be used to form a stacked assembly. In the stacked assembly 50, the package 10-1 is termed the upper package, the package 10-2 is termed the middle package, and the package 10-3 is termed the lower package.

Still referring to FIG. 2, the stacked assembly 50 is mounted to a supporting substrate 52 such as a printed circuit board, a mother board, a daughter board, a multi chip module substrate, or any other substrate configured as a component of an electronic device. The supporting substrate 52 includes a plurality of electrodes 54 configured to provide physical and electrical connection points for the stacked assembly 50. Each electrode 54 aligns with, and is adapted for mating electrical engagement with, a corresponding conductive groove 42 on the lower package 10-3. In addition, conductive fillets 56 physically bond, and electrically connect, the conductive grooves 42 on the lower package 10-3 to the electrodes 54 on the supporting substrate 52. The conductive fillets 56 can comprise a metal, such as solder, or a conductive polymer material, such as a curable conductive adhesive.

Still referring to FIG. 2, the stacking contacts 36 on the lower package 10-3 are bonded to the back side stacking pads 40 on the middle package 10-2. Similarly, the stacking contacts 36 on the middle package 10-2 are bonded to the back side stacking pads 40 on the upper package 10-1. This arrangement also electrically connects the circuit side stacking contacts 34 and the conductive grooves 42 on the packages 10-1, 10-2, 10-3 to one another. The stacked packages 10-1, 10-2, 10-3 in the stacked assembly 50 are thus electrically interconnected to one another, and to the electrodes 54 on the supporting substrate 52. As will be hereinafter described, bonding of the stacking contacts 36 to the back side stacking pads 40 can be accomplished using heat and pressure.

Still referring to FIG. 2, the stacked assembly 50 also includes a polymer adhesive layer 58 between the lower package 10-3 and the middle package 10-2, and a polymer adhesive layer 60 between the middle package 10-2 and the upper package 10-1. The polymer adhesive layers 58, 60 function to physically bond the packages 10-1, 10-2, 10-3 to one another. In addition, the polymer adhesive layers 58, 60 can comprise an anisotropic conductive adhesive such that electrical conductivity between the packages 10-1, 10-2, 10-3 is also provided. Specifically, an anisotropic conductive adhesive is electrically conductive in one direction (e.g., z-direction) and electrically insulating in the other two orthogonal directions (e.g., x direction and y direction). With an anisotropic adhesive used to construct the polymer adhesive layers 58, 60 separate electrical paths are provided through the polymer adhesive layers 58, 60 and direct electrical connections are provided between the conductive grooves 42 on the packages 10-1, 10-2, 10-3.

As previously described, separate electrical connections are also provided between the packages 10-1, 10-2, 10-3 by the stacking contacts 36. However, the polymer adhesive layers 58, 60 also functions as underfill layers to provide mechanical bonding between the packages 10-1, 10-2, 10-3. In addition, the polymer adhesive layers 58, 60 prevent tilting of the packages 10-1, 10-2, 10-3 during bonding of the stacking contacts 36 to the back side stacking pads 40.

Figure 3:
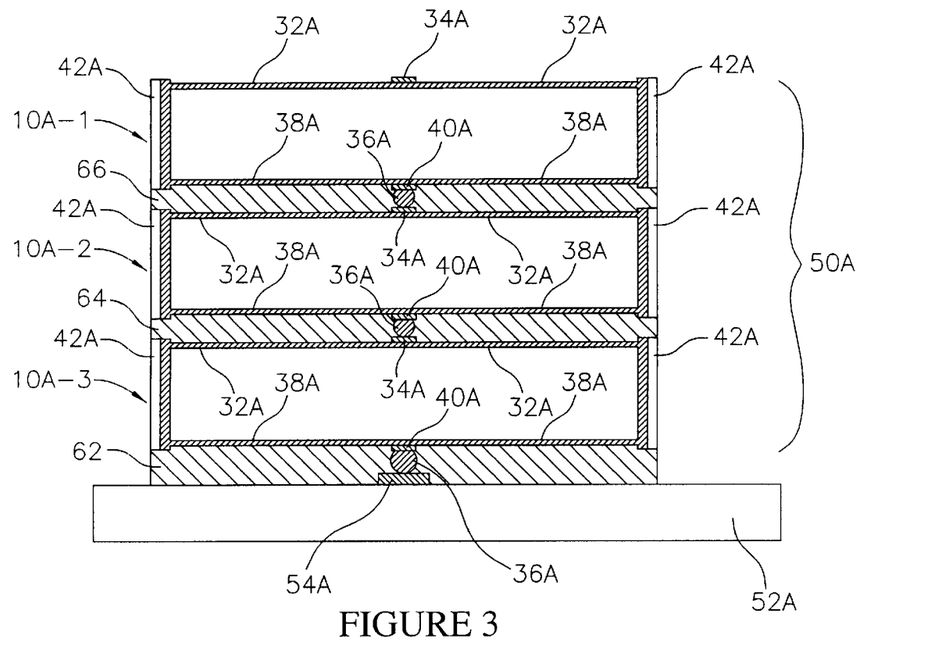
FIG. 3 is an enlarged cross sectional view of another stacked assembly constructed using the package of FIG. 1A.

Referring to FIG. 3, a stacked assembly 50A fabricated using three packages 10A-1, 10A-2, 10A-3 is illustrated. Each of the packages 10A-1, 10A-2, 10A-3 is constructed substantially as previously described for the package shown in FIGS. 1A–1F. As such, the packages 10A-1, 10A-2, 10A-3 include circuit side conductors 32A, circuit side stacking pads 34A, back side conductors 38A, back side stacking pads 40A, and conductive grooves 42A configured substantially as previously described for the equivalent components on package 10.

However, in this embodiment of the package, the stacking contacts 36A on a package are initially attached to the back side stacking pads 40A, and then bonded to the circuit side stacking pads 34A on an adjacent package during assembly of the stacked assembly 50A. In addition, the stacking contacts 36A on the lower package 10A-3 are bonded to electrodes 54A on a supporting substrate 52A. Further, a polymer adhesive layer 62 attaches the lower package 10A-3 to the supporting substrate 52A. Still further, a polymer adhesive layer 64 attaches the middle package 10A-2 to the lower package 10A-3, and a polymer adhesive layer 66 attaches the upper package 10A-1 to the middle package 10A-2. As with the previously described polymer adhesive layers 58, 60, the polymer adhesive layers 62, 64, 66 can comprise a conductive polymer such as an anisotropic conductive adhesive.

Figure 4:
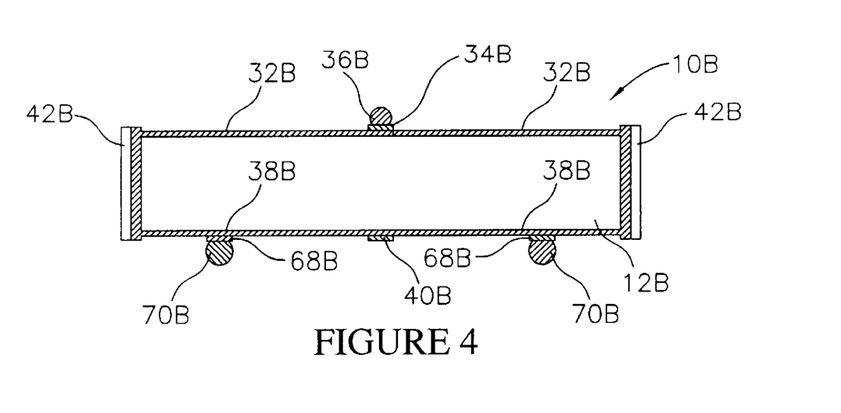
FIG. 4 is an enlarged cross sectional view of an alternate embodiment semiconductor package constructed in accordance with the invention.

Referring to FIG. 4, an alternate embodiment. semiconductor package 10B is illustrated. The semiconductor package 10B includes circuit side conductors 32B, circuit side stacking pads 34B, back side conductors 38B, back side stacking pads 40B, and conductive grooves 42B configured substantially as previously described for the equivalent components on package 10. However, the package 10B also includes external contact pads 68B and external contacts 70B. The external contacts 70B can comprise bumps or balls made of an electrically conductive bondable material such as solder, gold, silver, nickel, copper or a conductive polymer. The external contact pads 68B and the external contacts 70B are in electrical communication with the back side conductors 38B, with the back side stacking pads 40B, with the conductive grooves 42B, with the circuit side conductors 32B and with the circuit side stacking pads 34B. The external contacts 70B function as bonding contacts for bonding the package 10B to a supporting substrate, and also as electrical connection points from the outside to the package 10B.

Figure 5:
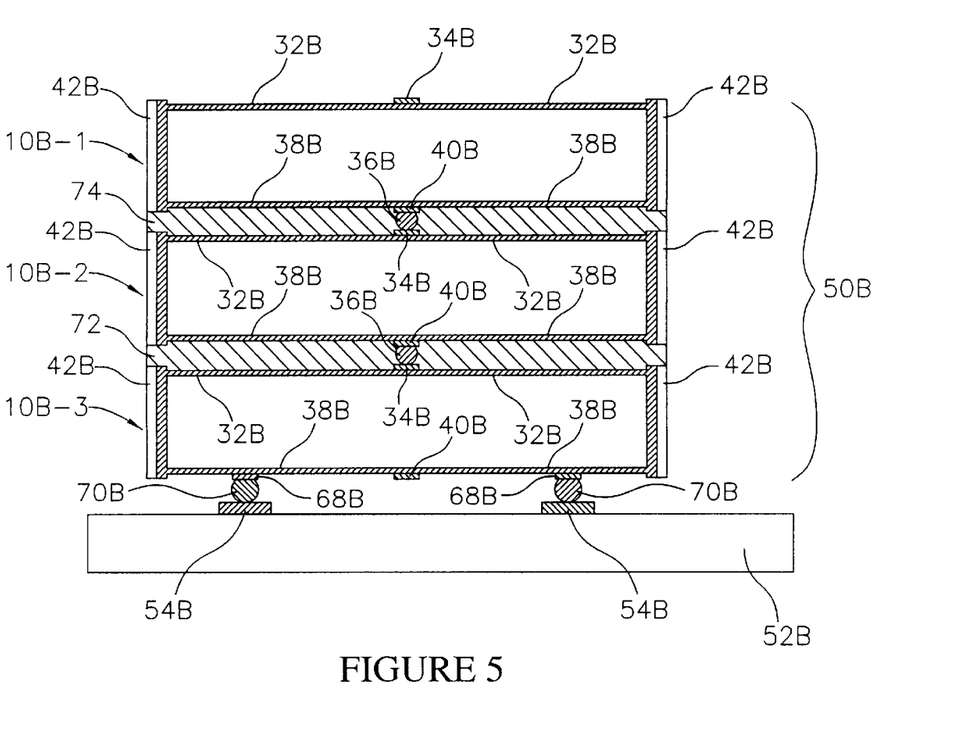
FIG. 5 is an enlarged cross sectional view of a stacked assembly constructed using the package of FIG. 4.

Referring to FIG. 5, a stacked assembly 50B fabricated using three packages 10B-1, 10B-2, 10B-3 is illustrated. Each of the packages 10B-1, 10B-2, 10B-3 is constructed substantially as previously described for the package 10B shown in FIG. 4. However, in this embodiment the external contacts 70B on the lower package 10B-3 are bonded to electrodes 54B on a supporting substrate 52B. In addition, the stacking contacts 36B on the lower package 10B-3 are bonded to the back side stacking pads 40B on the middle package 10B-2. Further, the stacking contacts 36B on the middle package 10B-2 are bonded to the back side stacking pads 40B on the upper package 10B-1. Still further, a polymer adhesive layer 72 attaches the lower package 10B-3 to the middle package 10B-2. In addition, a polymer adhesive layer 74 attaches the middle package 10B-2 to the upper package 10B-1. As with the previously described polymer adhesive layers 58, 60, 62, 64, 66, the polymer adhesive layers 72, 74 can comprise a conductive polymer such as an anisotropic conductive adhesive.

Figure 6:
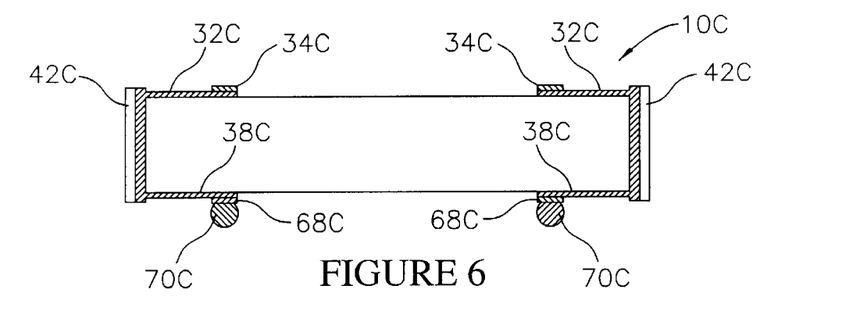
FIG. 6 is an enlarged cross sectional view of another alternate embodiment semiconductor package constructed in accordance with the invention.

Referring to FIG. 6, an alternate embodiment semiconductor package 10C is illustrated. The semiconductor package 10C includes circuit side conductors 32C, circuit side stacking pads 34C, back side conductors 38C, and conductive grooves 42C configured substantially as previously described for the equivalent components on package 10. However, the package 10C also includes external contact pads 68C and external contacts 70C. The external contact pads 68C and the external contacts 70C are in electrical communication with the back side conductors 38C, with the conductive grooves 42C, with the circuit side conductors 32C and with the circuit side stacking pads 34C. The external contacts 70C also function as the stacking contacts for the package 10C. In addition, the external contacts 70C function as bonding contacts for bonding the package 10C to a supporting substrate and as electrical connection points from the outside to the package 10C. The external contacts 70C can comprise bumps or balls made of an electrically conductive bondable material such as solder, gold, silver, nickel, copper or a conductive polymer.

Figure 7:
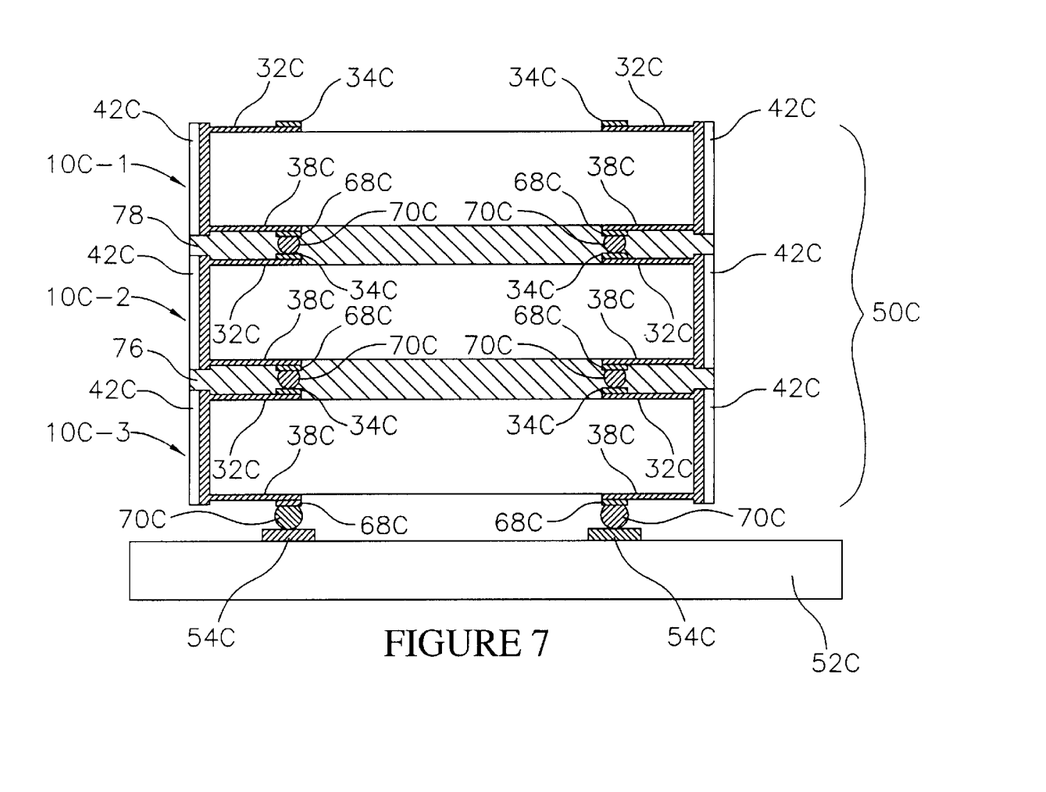
FIG. 7 is an enlarged cross sectional view of a stacked assembly constructed using the package of FIG. 6.

Referring to FIG. 7, a stacked assembly 50C fabricated using three packages 10C-1, 10C-2, 10C-3 is illustrated. Each of the packages 10C-1, 10C-2, 10C-3 is constructed substantially as previously described for the package 10C shown in FIG. 6. However, in this embodiment the external contacts 70C on the lower package 10C-3 are bonded to electrodes 54C on a supporting substrate 52C. In addition, the external contacts 70C on the middle package 10C-2 are bonded to the circuit side stacking pads 34C on the lower package 10B-3. Further, the external contacts 36C on the upper package 10B-1 are bonded to the circuit side stacking pads 34C on the middle package 10C-2. Still further, a polymer adhesive layer 76 attaches the lower package 10C-3 to the middle package 10C-2. In addition, a polymer adhesive layer 78 attaches the middle package 10C-2 to the upper package 10C-1. As with the previously described polymer adhesive layers 58, 60, 62, 64, 66, 72, 74, the polymer adhesive layers 76, 78 can comprise a conductive polymer such as an anisotropic conductive adhesive.

Referring to FIGS. 8A–8I, steps in the method for fabricating the package 10 (FIG. 1A) and the stacked assembly 50 (FIG. 2) are illustrated. Although, the method is illustrated in connection with fabrication of the package 10 and the assembly 50 essentially the same method can be used to fabricate the package 10A (FIG. 3), the stacked assembly 50A (FIG. 3), the package 10B (FIG. 4), the stacked assembly 50B (FIG. 5), the package 10C (FIG. 6) or the stacked assembly 50C (FIG. 7).

Figure 8A:
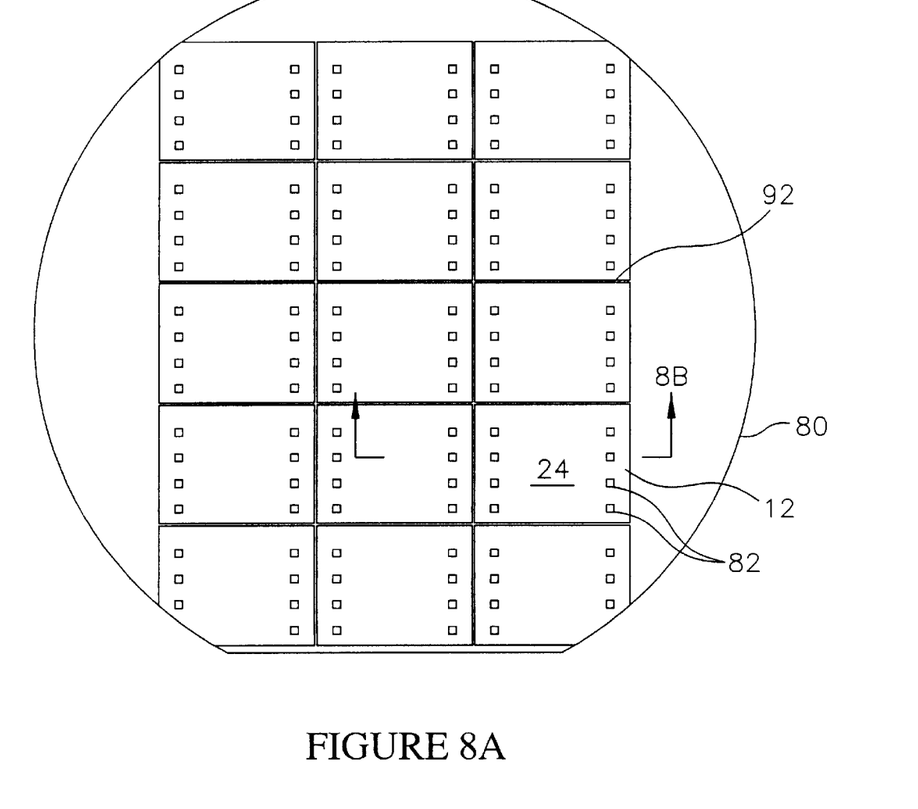
FIG. 8A is a plan view of a substrate in the form of a semiconductor wafer containing semiconductor dice configured for fabricating packages in accordance with the method of the invention.
Figure 8B:
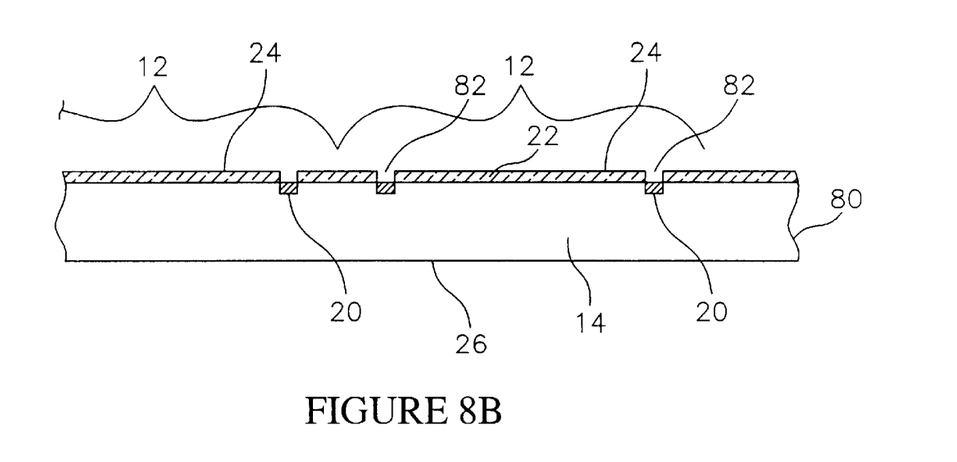
FIG. 8B is an enlarged cross sectional view taken along section line 8B—8B of FIG. 8A illustrating adjacent dice on the substrate.

Initially, as shown in FIGS. 8A and 8B, a substrate 80 containing a plurality of semiconductor dice 12 is provided. In the illustrative embodiment, the substrate 80 comprises a semiconductor wafer. However, the substrate 80 can also comprise a portion of a wafer, or a panel, a strip or another element containing semiconductor dice. As another example, the substrate 80 can comprise a panel or a strip containing a plurality of partially completed semiconductor packages or components. In this case the substrate 80 can be made of an organic material, such as a glass filled resin, such as epoxy glass (FR-4), polyimide glass, or a cyanate-glass material.

Each die 12 includes a circuit side 24 and a back side 26. In addition, each die 12 includes a pattern of die bond pads 20 in electrical communication with the integrated circuits 16 (FIG. 1F) contained on the semiconductor substrate 14. Each die 12 also includes the passivation layer 22, such as BPSG, and openings 82 through the passivation layer 22 to the die bond pads 20. As shown in FIG. 8A, the substrate 80 also includes spaces 92 between the dice 12 configured as streets for saw cutting or otherwise singulating the completed packages 10 (FIG. 8I).

Figure 8C:
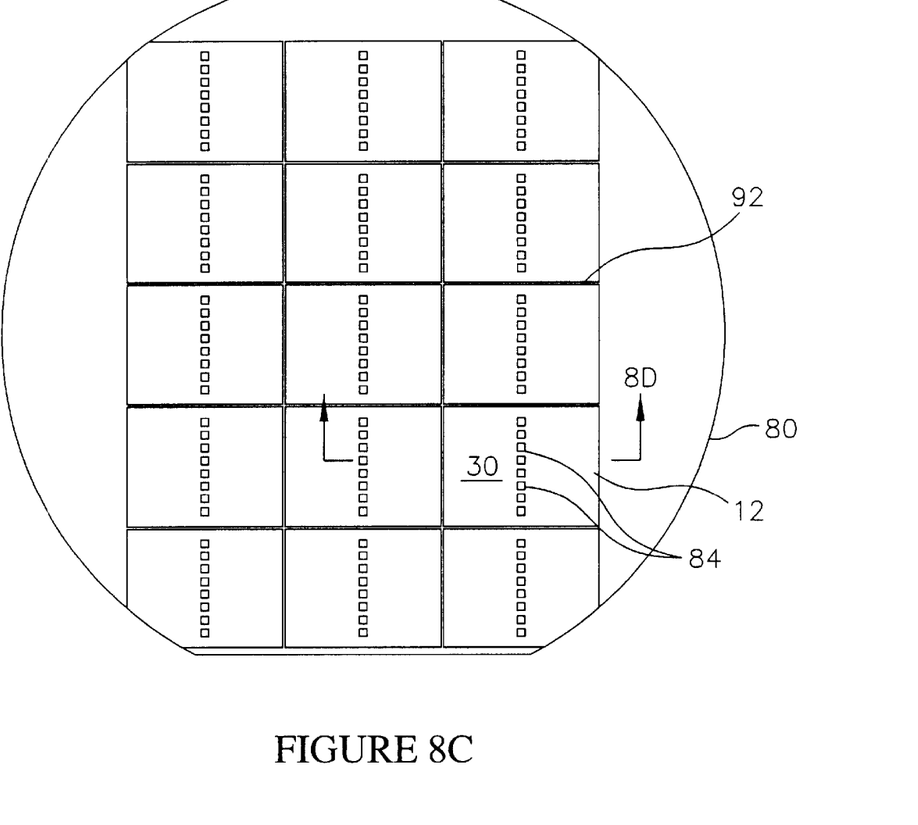
FIG. 8C is a plan view of the substrate following forming of redistribution conductors on the dice.
Figure 8D:
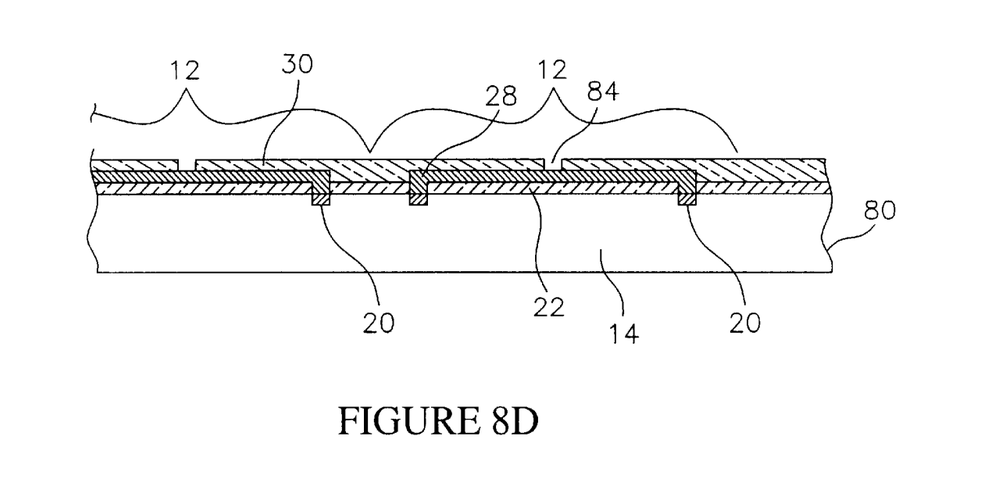
FIG. 8D is an enlarged cross sectional view taken along section line 8D—8D of FIG. 8C illustrating the redistribution conductors.

Referring to FIGS. 8C and 8D, after the substrate 80 and the dice 12 are provided, the redistribution conductors 28 are formed on the circuit sides 24 of the dice 12 in electrical communication with the die bond pads 20. Preferably the redistribution conductors 28 comprise a highly conductive metal such as aluminum or an alloy thereof. Other suitable metals include copper, nickel, silver, tungsten, tantalum, palladium, or alloys of these metals.

The redistribution conductors 28 can be formed using a subtractive process or an additive process. With a subtractive process a redistribution layer (RDL) can be blanket deposited using a suitable deposition process such as CVD, PECVD, LPCVD or sputtering. A mask (not shown) formed of a photoimageable material such as a resist can then be formed on the redistribution layer and used to etch the layer to form the redistribution conductors 28. Either a wet or a dry etch process can be used to etch the redistribution layer to form the redistribution conductors 28. Following this etch step, the mask can be "stripped" or "lifted off" using a suitable process. The redistribution conductors 28 can also be formed using an additive process such as deposition through a mask.

As also shown in FIG. 8D, following forming of the redistribution conductors 28, the insulating layer 30, and a pattern of openings 84 through the insulating layer 30 to the redistribution conductors 28 are formed. The insulating layer 30 can be initially blanket deposited using a suitable deposition process, such as spin on, CVD, PCVD or evaporation. One method for forming the openings 84 is to deposit a layer of resist on the blanket deposited layer. The layer of resist can then be exposed using a direct imaging process to form a mask for etching the openings 84. As another alternative, the insulating layer 30 can comprise a photoimageable polymer, such as a layer of resist that is exposed using a direct imaging process and then developed to form the openings 84. For example, the insulating layer 30 can comprise photoimageable polyimide, deposited to a desired thickness, cured and then patterned with the openings 80 to the redistribution conductors 28. The openings 80 are formed in a pattern required for the circuit side stacking pads 34 (FIG. 8G) and the stacking contacts 36 (FIG. 8G). In some cases the redistribution conductors 28 and the insulating layer 30 can be eliminated entirely by making the die bond pads 20 in the required pattern for the circuit side stacking pads 34. In this case, the stacking contacts 36 can be formed directly on the die bond pads 20.

Figure 8E:
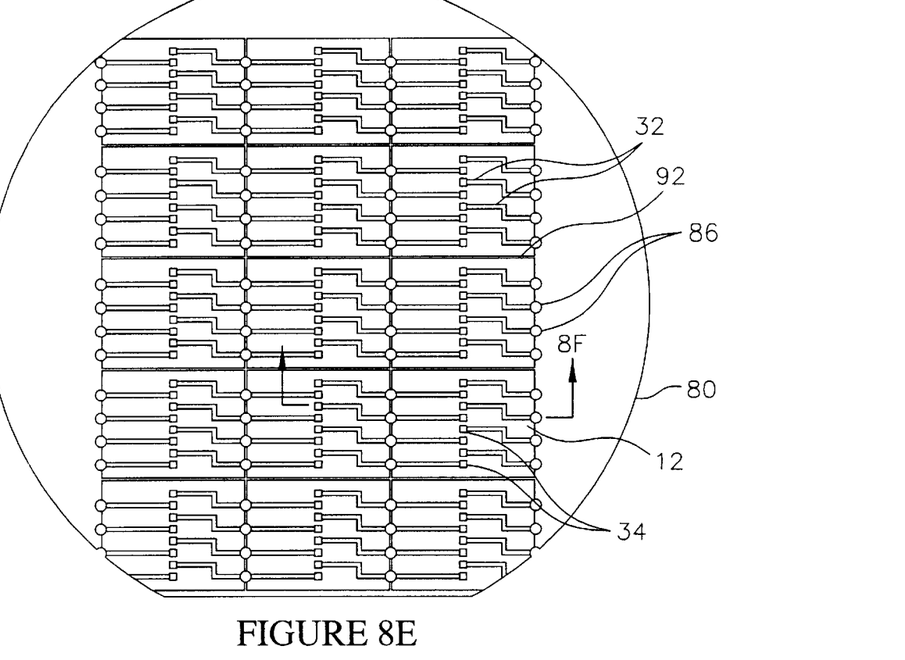
FIG. 8E is a plan view of the substrate following forming of circuit side conductors, circuit side stacking pads and openings for conductive grooves on the dice.
Figure 8F:
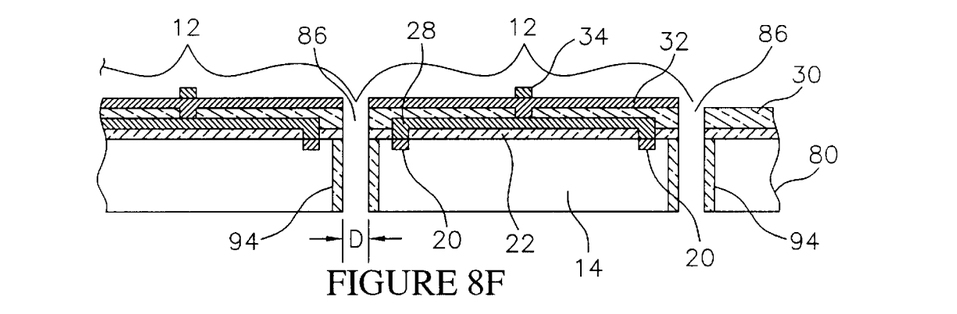
FIG. 8F is an enlarged cross sectional view taken along section line 8F—8F of FIG. 8E illustrating the circuit side conductors, the stacking pads and the openings.
Figure 8G:
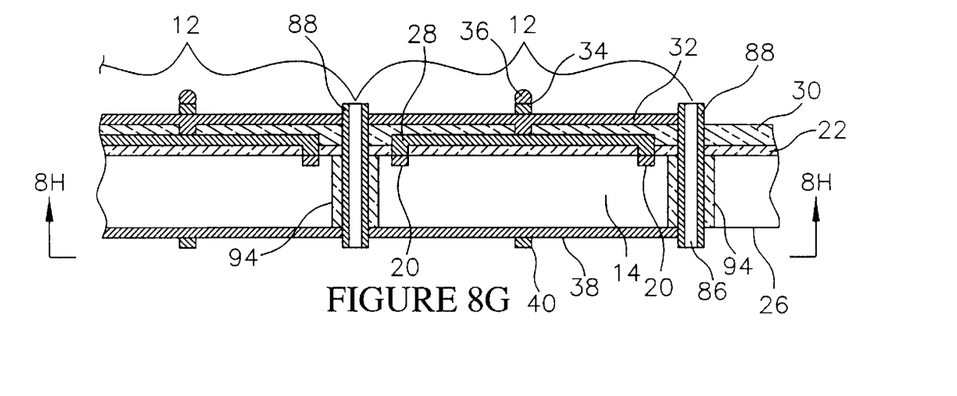
FIG. 8G is an enlarged cross sectional view equivalent to FIG. 8F following forming of back side conductors and back side stacking pads on the dice.

Referring to FIGS. 8E and 8F, following forming of the redistribution conductors 28 and the insulating layer 30, the circuit side conductors 32 can be formed on the circuit sides 24 of the dice 12. The circuit side conductors 32 can be formed using an additive process or a subtractive process substantially as previously described for the redistribution conductors 28. In addition, the circuit side conductors 32 can comprise a highly conductive metal such as aluminum, copper, nickel, silver, tungsten, tantalum, palladium, or alloys of these metals.

As also shown in FIGS. 8E and 8F, the circuit side stacking pads 34 can be formed in a required pattern on terminal portions of the circuit side conductors 32. In the illustrative embodiment, the circuit side stacking pads 34 are formed in alignment with the openings 84 (FIG. 8D) in the insulating layer 30. However, as is apparent to those skilled in the art, other arrangements are possible. In addition, the circuit side stacking pads 34 can comprise the same metal as the circuit side conductors 32, or alternately a non-oxidizing metal such as gold, platinum or alloys of these metals. In the case of a non-oxidizing metal electroless deposition, electrolytic deposition or other suitable plating process can be employed to form the circuit side stacking pads 34 with a required thickness and peripheral outline.

As also shown in FIGS. 8E and 8F, openings 86 can also be formed through the substrate 80 in the spaces 92 between the dice 12. The openings 86 have outside diameters "D" that are larger than the widths of the spaces 92, such that following saw cutting through the spaces 92 arcuate or semi-circular portions of the openings 86 remain on the dice 12. A representative diameter "D" for the openings is from about 100 $\mu$m to several mils, or greater depending on the width of the spaces 92 (FIG. 8A) on the substrate 80 which provide the streets for singulation of the substrate 80.

Following plating with a conductive material 88 (FIG. 8G) the openings 86 form the conductive grooves 42 (FIG. 1A) for the packages 10. One method for forming the openings 86 is with an etching process performed using a mask and a suitable etchant or etchants. One suitable etchant for a substrate 14 made of silicon, is a solution of potassium hydroxide (KOH), or alternately a solution of tetra-methyl ammonium hydroxide (TMAH). Another method for forming the openings 86 is with a laser machining process. Such a process is described in U.S. Pat. No. 6,114,240 to Akram et al., which is incorporated herein by reference.

As also shown in FIG. 8F, the openings 86 must include insulating layers 94 to prevent electrical conduction between the conductive grooves 42 (FIG. 1A) and the substrate 14 which typically comprises a semiconductor. With the substrate 14 comprising silicon, one method for forming the insulating layers 94 is by growing or depositing silicon dioxide ($SiO_2$) in the openings 86. For example, silicon dioxide can be deposited by CVD or by exposing the openings 86 to an oxidizing atmosphere such as steam and $O_2$ at an elevated temperature (e.g., 950° C.). The insulating layers 94 can also comprise an insulating polymer such as polyimide deposited or injected into the openings 86 using a spin on, injection or capillary process. A representative thickness of the insulating layers can be from about 100 Å to several mils.

Referring to FIG. 8G, following forming of the insulating layers 94, the conductive layers 88 can be formed in the openings 86 and on the insulating layers 94. The conductive layers 88 can comprise tubular layers on the sidewalls of the openings 86 substantially as shown. Alternately, the conductive layers 88 can comprise cylindrical plugs (not shown) that completely fill the openings 86. The conductive layers 88 can comprise a conductive metal or a conductive polymer deposited into the openings 86 using a suitable deposition process such as CVD, electroless deposition, electrolytic deposition, or screen printing. A conductive metal or a conductive polymer can also be injected into the openings 86 using a vacuum system and capillary action.

Still referring to FIG. 8G, the back side conductors 38, and the back side stacking pads 40 can also be formed on the back sides 26 of the dice 12. The back side conductors 38 and the back side stacking pads 40 can be formed prior to or after forming of the conductive layers 88 in the openings 86. However, in either case, the back side conductors 38 and the circuit side conductors 32 must be in electrical contact with the conductive layers 88 such that the conductive grooves 42 (FIG. 1A) function as interlevel conductors.

Figure 8H:
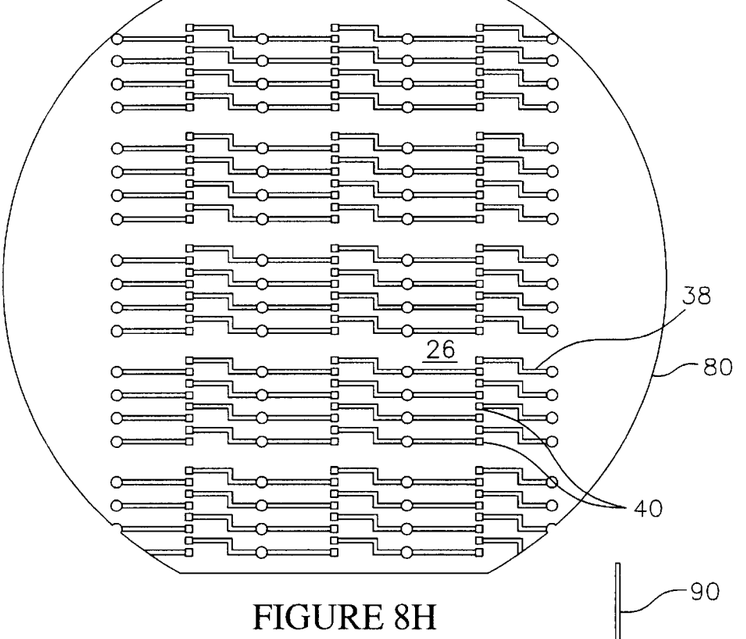
FIG. 8H is a bottom view of the wafer taken along line 8H—8H of FIG. 8G illustrating the back side conductors and the back side stacking pads.
Figure 8I:
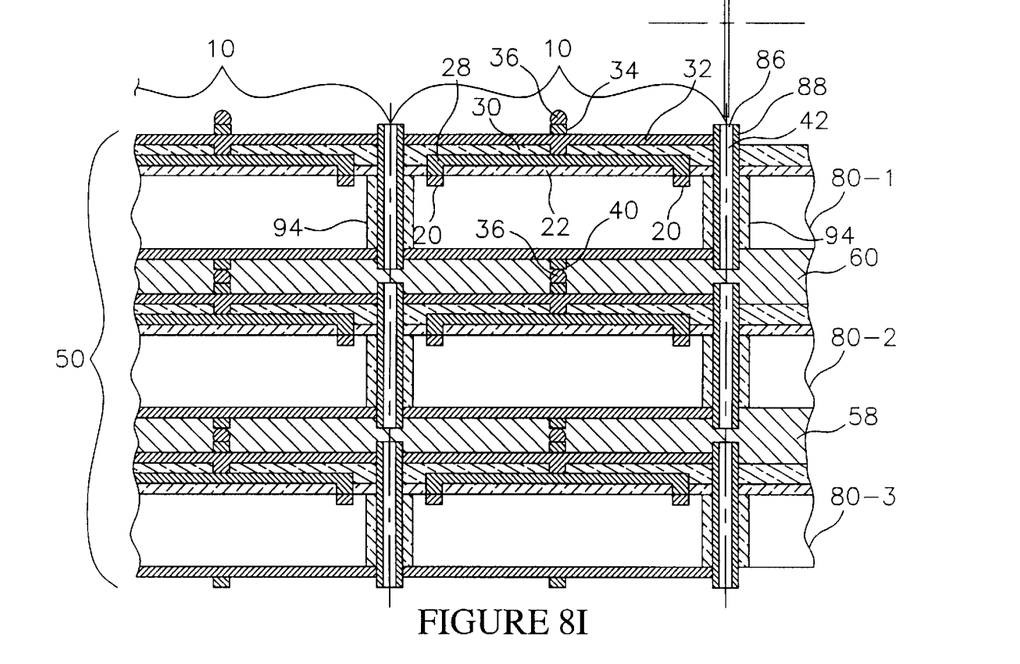
FIG. 8I is a schematic cross sectional view of stacked substrates containing the completed packages during singulation to form stacked assemblies.

Either a subtractive process or an additive process as previously described for the circuit side conductors 32 and the circuit side stacking pads 34, can be used to form the back side conductors 38 and the back side stacking pads 40. In addition, the same materials as previously described for forming the circuit side conductors 32 and the circuit side stacking pads 34, can be used to form the back side conductors 38 and the back side stacking pads 40. The pattern of the back side stacking pads 40 exactly matches the pattern of the circuit side stacking pads 34 to permit stacking of multiple substrates 80. FIG. 8H shows the pattern of the back side stacking pads 40 and the back side conductors 38 as well.

As also shown in FIG. 8G, the stacking contacts 36 can be formed on the circuit side stacking pads 34. The stacking contacts 36 can comprise a non-oxidizing metal such as gold or platinum. For reflow applications, the stacking contacts 36 can comprise a solder alloy such as 95% Pb/5% Sn, 60% Pb/40% Sn, 63% In/37% Sn, or 62% Pb/36% Sn/2% Ag. Alternately, the stacking contacts 36 can comprise a relatively hard metal 10 such as nickel, copper, beryllium copper, alloys of nickel, alloys of copper, alloys of beryllium copper, nickel-cobalt-iron alloys and iron-nickel alloys. The stacking contacts 36 can also comprise a base metal and an outer layer formed of a non-oxidizing metal such as gold or platinum. In addition, the stacking contacts 36 can comprise a conductive polymer such as an isotropic or anisotropic adhesive.

One method for attaching the stacking contacts 36 to the circuit side stacking pads 34 is by bonding pre-fabricated metal balls to the circuit side stacking pads 34. For example, pre-fabricated metal balls are manufactured by Mitsui Comtek Corp. of Saratoga, Calif. under the trademark "SENJU SPARKLE BALLS". The metal balls can be attached to the circuit side stacking pads 34 by soldering, laser reflow, brazing, welding, or applying a conductive adhesive.

A solder ball bumper can also be used to bond the stacking contacts 36 to the circuit side stacking pads 34. A suitable solder ball bumper is manufactured by Pac Tech Packaging Technologies of Falkensee, Germany. The stacking contacts 36 can also be formed on the circuit side stacking pads 34 using a conventional wire bonder apparatus adapted to form a ball bond, and then to sever the attached wire. The stacking contacts 36 can also be formed by electrolytic deposition or electroless deposition of a metal to form bumps.

In the embodiment of the package 10B shown in FIG. 4 having external contacts 70B, and the package 10C shown in FIG. 6 having external contacts 70C, the external contacts 70B, 70C can be formed using the same techniques and materials as used for the stacking contacts 36.

Referring to FIG. 8I the completed packages 10 are illustrated prior to singulation from the substrate 80. However, prior to singulation substrates-80-1, 80-2 and 80-3 can be stacked to one another for forming stacked assemblies 50. In this example, the substrates 80-1, 80-2, 80-3 are substantially identical. In addition, the stacking contacts 36 on the lower substrate 80-1 are bonded to the back side stacking pads 40 on the middle substrate 80-2, and the stacking contacts 36 on the middle substrate 80-2 are bonded to the back side stacking pads 40 on the upper substrate 80-3. One method for bonding the stacking contacts 36 to the back side stacking pads 40 is by heating in an oven such that the stacking contacts 36 reflow and form a metallurgical bond. A weight or a jig can also be used to apply pressure to the stacking contacts 36 during the reflow process.

As also shown in FIG. 8I, the polymer adhesive layer 58 can be formed between the lower substrate 80-3 and the middle substrate 80-2, and the polymer adhesive layer 60 can be formed between the middle substrate 80-2 and the upper substrate 80-1. The polymer adhesive layers 58, 60 can be deposited in viscous form and then cured. If the polymer adhesive layers 58, 60 comprise a conductive polymer, such as an anisotropic adhesive, a weight or a jig can be used during the curing step to compress the adhesive layers 58, 60. The polymer adhesive layers 58, 60 help to bond the substrates 80-1, 80-2, 80-3 together and to rigidify the stacked assembly 50.

With the substrates 80-1, 80-2, 80-3 stacked and bonded to one another, a saw blade 90 can be used to singulate the stacked assemblies 50. In addition, the saw blade 90 cuts through a center line of the openings 86, such that the conductive vias 42 are formed in the edges of each package 10 substantially as previously described. Rather than using a saw blade 90, the singulation step can be performed using a shearing tool or a pressurized water jet. In addition, the singulation step can be performed on a single substrate 80 rather than on a stack, such that individual packages 10 will be formed.

Thus the invention provides a stackable semiconductor package, a method for fabricating the package, and a stacked assembly constructed with the package. While the invention has been described with reference to certain preferred embodiments, as will be apparent to those skilled in the art, certain changes and modifications can be made without departing from the scope of the invention as defined by the following claims.

What is claimed is:

1. A method for fabricating semiconductor packages comprising:
   providing a plurality of semiconductor dice on a substrate having a first side and an opposing second side;
   forming a plurality of first conductors on the first side and a plurality of second conductors on the second side;
   forming a plurality of conductive vias in the substrate between the dice and in electrical communication with the first conductors and the second conductors; and
   cutting through the substrate and through the conductive vias to separate the dice and form a plurality of conductive grooves therein.

2. The method of claim 1 further comprising forming a plurality of stacking contacts on the dice on the first side in electrical communication with the first conductors and a plurality of stacking pads on the dice on the second side in electrical communication with the second conductors.

3. The method of claim 1 further comprising forming a plurality of stacking pads on the dice on the first side in electrical communication with the first conductors and a plurality of stacking contacts on the dice on the second side in electrical communication with the second conductors.

4. The method of claim 1 further comprising prior to the cutting step stacking the substrate on a second substrate substantially identical to the substrate.

5. The method of claim 1 further comprising stacking and bonding the substrate to a substantially identical second substrate prior to the cutting step.

6. The method of claim 1 wherein the conductive grooves comprise semi-circular portions.

7. A method for fabricating a semiconductor package comprising:
   providing a substrate containing a semiconductor die having opposing sides;
   forming a plurality of conductors on the opposing sides;
   forming a plurality of conductive openings in the substrate at least partially on the die and in electrical communication with the conductors; and
   separating the die from the substrate by cutting through the openings to form the package with a peripheral edge corresponding to that of the die and conductive grooves in the peripheral edge.

8. The method of claim 7 further comprising forming a plurality of stacking pads and stacking contacts on the opposing sides in electrical communication with the conductors.

9. The method of claim 7 further comprising forming a plurality of external contacts on the die in electrical communication with the conductors.

10. The method of claim 7 wherein the substrate comprises a semiconductor wafer containing a plurality of dice.

11. The method of claim 7 further comprising stacking the substrate on a second substrate, bonding the second substrate to the substrate, and performing the separating step on the substrate bonded to the second substrate.

12. A method for fabricating semiconductor packages comprising:

providing a plurality of semiconductor dice on a substrate having a first side and a second side;

forming a plurality of stacking contacts on the dice on the first side in a selected pattern;

forming a plurality of stacking pads on the dice on the second side in the selected pattern;

forming a plurality of openings in the substrate between the dice;

forming conductive layers in the openings in electrical communication with the stacking contacts and with the stacking pads;

stacking the substrate to a substantially identical second substrate and bonding the stacking contacts to second stacking pads on the second substrate; and cutting through the substrate, through the second substrate and through the conductive vias to separate the dice.

13. The method of claim 12 wherein the stacking contacts comprise bumps or balls.

14. The method of claim 12 wherein the conductive grooves include semi-circular portions of the openings.

15. The method of claim 12 wherein the conductive layers cover sidewalls of the openings.

16. A method for fabricating semiconductor packages comprising:

providing a plurality of semiconductor dice on a substrate having a first side and a second side;

forming a plurality of conductors on the first side and on the second side;

forming a plurality of openings in the substrate between the dice;

forming conductive layers in the openings in electrical communication with the conductors;

stacking the substrate to a substantially identical second substrate with the conductors on the dice on the second substrate in electrical communication with the conductors on the dice on the substrate; and cutting through the substrate, through the second substrate and through the conductive vias to separate the dice.

17. The method of claim 16 further comprising forming a plurality of stacking contacts on the dice in electrical communication with the conductors.

18. The method of claim 16 wherein the cutting step forms a plurality of conductive grooves in peripheral edges of the dice.

19. The method of claim 16 further comprising forming a plurality of stacking contacts on the dice comprising bumps or balls in electrical communication with the conductors.

* * * * *